(12) United States Patent
Xiao et al.

(10) Patent No.: US 10,483,860 B1
(45) Date of Patent: Nov. 19, 2019

(54) PRIMARY SIDE CONSTANT CURRENT REGULATION

(71) Applicant: SEMICONDUCTOR COMPONENTS INDUSTRIES, LLC, Phoenix, AZ (US)

(72) Inventors: Haibin Xiao, LiaoBu Town (CN); W K Chong, Ma On Shan (HK)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/007,364

(22) Filed: Jun. 13, 2018

(51) Int. Cl.
| | |
|---|---|
| H02M 3/335 | (2006.01) |
| H02M 1/08 | (2006.01) |
| G01R 15/18 | (2006.01) |
| G01R 19/00 | (2006.01) |
| H02M 3/155 | (2006.01) |
| H02M 1/00 | (2006.01) |

(52) U.S. Cl.
CPC ........ *H02M 3/33569* (2013.01); *G01R 15/18* (2013.01); *G01R 19/0092* (2013.01); *H02M 1/08* (2013.01); *H02M 3/155* (2013.01); *H02M 2001/0009* (2013.01)

(58) Field of Classification Search
CPC ........... H02M 2001/0009; H02M 1/42; H02M 1/4208; H02M 1/4241; H02M 3/335; H02M 3/33507; H02M 3/33523
See application file for complete search history.

(56) References Cited

U.S. PATENT DOCUMENTS

2015/0381055 A1* 12/2015 Ohtake ............. H02M 3/33507
363/21.02
2016/0057822 A1* 2/2016 Chu .................... H02M 1/4208
315/201
(Continued)

OTHER PUBLICATIONS

Infineon, "ICL5101 Resonant controller IC with PFC for LED driver," Datasheet, Rev. 1.3, Jan. 15, 2016. [Online]. Available: https://www.infineon.com/dgdl/Infineon-ICL5101-DS-v01_30-EN.pdf?fileId=5546d4624b0b249c014b73386f216550. [Accessed May 18, 2018].
(Continued)

*Primary Examiner* — Gary L Laxton
(74) *Attorney, Agent, or Firm* — Wash Park IP Ltd.; John T. Kennedy

(57) ABSTRACT

Various embodiments of devices, systems, and methods for regulating the output current of a switched mode, resonant power converter using primary side regulation. For at least one embodiment, a circuit for primary side regulation of a constant output current resonant transformer includes a transformer having a first coil with a first terminal and a second terminal. A controller circuit is configured to receive an input voltage and a resonant circuit is coupled to the controller circuit and the first terminal. A current sense circuit is coupled to the second terminal and to the controller circuit. The current sense circuit is configured to detect fluctuations in a sensed resulting voltage potential representative of the output current of the transformer. The current sense circuit is configured to provide a feedback signal to the controller circuit when the sensed resulting voltage potential is greater than a reference voltage.

20 Claims, 5 Drawing Sheets

(56) References Cited

U.S. PATENT DOCUMENTS

2017/0237356 A1* 8/2017 Chen ............... H02M 3/33553
                                                363/21.02
2019/0044430 A1* 2/2019 Moon ............... H02M 3/33515

OTHER PUBLICATIONS

Infineon, "110 W / 54 V Power Supply Demo Board using ICL5101 in PFC & LLC Topology," Rev. 2.2, Sep. 22, 2015. [Online]. Available: https://www.infineon.com/dgdl/Infineon-ICL5101-AN-v02_02-EN.pdf?fileId=5546d462503812bb015046008b145ff7. [Accessed May 18, 2018].

ON Semiconductor, "NCP1602 Enhanced, High-Efficiency Power Factor Controller," Publication Order No. NCP1602/D, Rev. 7, Dec. 2017. [Online]. Available: www.onsemi.com. [Accessed May 18, 2018].

ON Semiconductor, "NCL30059 High-Voltage Half-Brdige Controller for LED Lighting Applications," Publication Order No. NCL30059/D, Rev. P1, Feb. 2017. [Online]. Available: www.onsemi.com. [Accessed May 18, 2018].

ON Semiconductor, "TLV431, NCV431, SCV431 Low Voltage Precision Adjustable Shunt Regulator," Publication Order No. TLV431A/D, Rev. 23, Jun. 2017. [Online]. Available: www.onsemi.com. [Accessed May 18, 2018].

* cited by examiner

US 10,483,860 B1

PRIMARY SIDE CONSTANT CURRENT REGULATION

TECHNICAL FIELD

The technology described herein generally relates methods, systems, and apparatus for controlling currents and voltages produced by power converters. The technology described herein also relates to methods, systems, and apparatus for controlling currents and voltages produced by switch mode operated power converters. More specifically, the technology described herein relates to methods, systems, and apparatus for regulating a constant current provided by a switch mode power converter, where primary side regulation is used. Even more specifically, the technology described herein related to methods, systems, and apparatus for regulating a constant current provided by a resonant switch mode power converter, where primary side regulation is used.

The technology may find use in conjunction with various electronic devices, such as power converters, light emitting diode assemblies, and various other devices and systems where a constant current is desired to be output by a power converter over low, medium and/or high-power ranges.

BACKGROUND

Today, power converters are commonly used in conjunction with various devices such as light emitting diode (LED) assemblies, automobiles, mobile phones, tablets, computers, and other devices to convert line voltages, into various output voltages and currents. Often a power converter is configured to provide a constant output current, while the output voltage may fluctuate over time.

One type of power converter commonly used today is a switched mode power supply. Switched mode power supplies may include the use of various topologies, including buck converter, boost converter, inverting and flyback. The flyback topology commonly includes a transformer having a first (primary) coil that is electrically isolated from a second (secondary) coil, and often a third (sensing) coil. The primary coil is commonly coupled to an input power source and the secondary coil is commonly coupled to a load, such as an LED assembly. Typically, one of two approaches are used to regulate a power converter such that a constant current can be provided to a load. For a first approach, the output current is monitored at the secondary coil and the values thereof are relayed back to the primary side, where the regulating occurs by adjusting the frequency and/or pulse width during which the currents arise in the primary coil of the transformer. Such secondary side regulation often involves the use of opto-couplers or other components to provide electrical isolation between the primary and secondary sides of the power converter. Secondary side regulation, however, is a complex solution. For the second approach, primary side regulation is used, where the output current on the secondary side is approximated based upon the input voltages and currents sensed on the primary side of the power converter. It is commonly appreciated that by adjusting the duty cycle (the ratio of the time that the primary coil is "on" versus the total time the primary coil is both "on" and "off" time), the voltages induced in the primary coil and thereby in the output voltage of the transformer may be varied. Likewise, by adjusting the operating frequency, the currents produced by the power transformer may be regulated. While primary side regulation is common in low-power implementations, for medium and high-power implementations, for example, those where resonant circuit technologies are utilized, a suitable primary side regulation technique is needed.

The various embodiments of the present disclosure address the above and other concerns by providing devices, systems, and methods for providing primary side regulation in medium and high-power power converters, including those using resonant circuit technologies.

SUMMARY

In accordance with at least one embodiment of the present disclosure an apparatus, system, or method for regulating a constant current output by a switched mode power converter using primary side current regulation is provided. At least one embodiment may be utilized in conjunction with low, medium or high-power implementations. As used herein, a low power implementation occurs when the output power of a power converter is typically less than 20 watts. A high-power implementation occurs when the output power of a power converter is typically greater than 50 watts. A medium power implementation is one typically arising between 20 and 50 watts. It is to be appreciated that the above described ranges are for purposes of illustration of comparative differences in power ranges and a distinction between a low, medium or high-power implementation may vary based upon the intended implementation and the devices used for any such system. One or more implementations of the present disclosure may be configured to support low, medium, high and/or combinations thereof power ranges for output power converters. It is to be further appreciated that a power converter may include two or more tertiary windings such that a single power converter can provide various ranges of output powers. One or more of such tertiary windings may provider higher or lower power ranges than a secondary winding. Such tertiary windings may be utilized to further regulate operation of a power converter. The present disclosure is not to be limited to any ranges or permutations of output power converter output ranges, number of windings or otherwise.

In accordance with at least one embodiment of the present disclosure, a power converter may include a current sense circuit. For at least one embodiment, a current sense circuit may include a first sense diode having a first diode anode and a first diode cathode. The first diode anode may be grounded, and the first diode cathode may be connected to a second terminal of a first coil of a transformer having an operating frequency ($T_{SW}$). For at least one embodiment, a current sense circuit may include a first coil having a first terminal coupled to an input voltage and received at an input current ($I_P$). The transformer may include a second coil coupled to at least one output node providing an output voltage and an output current ($I_O$). For at least one embodiment, a current sense circuit may include a second sense diode having a second diode anode and a second diode cathode. A sensing resistor providing a sense resistance and a sensing capacitor may be grounded. And, for at least one embodiment, the second diode anode may be connected to the second terminal and the second diode cathode may be connected, in parallel, to the sensing resistor, the sensing capacitor, and the compensating resistor at a voltage sense node.

For at least one embodiment, a current sense circuit may include a voltage reference regulator configured to operate at a reference voltage ($V_{REF}$). The voltage reference regulator may include a ground node, a first reference node, and a second reference node. For at least one embodiment, a current sense circuit may include use of a set resistor having a set resistance. The set resistor may be configured to receive a sensed voltage ($V_S$). For at least one embodiment, a compensating resistor having a compensating resistance may be used. The compensating resistor may be connected, in parallel, at the first reference node, to the set resistor.

For at least one embodiment, a current sense circuit may include a circuit configured such that the output current ($I_O$) is output at a constant value over two or more cycles of the transformer. For at least one embodiment, the output current ($I_O$) is a function of a sense resistance. For at least one embodiment, a current sense circuit may include use of a current sense circuit having as a sensing resistor a variable resistance resistor.

For at least one embodiment, a current sense circuit may include a circuit configured such that the output current ($I_O$) is defined pursuant to the equation:

$$I_O \cong \left(2 \times \left(\frac{V_{REF}}{R_{SNS}}\right)\right) \div N$$

where:
N=a coil ratio for the transformer.

For at least one embodiment, a current sense circuit may include a circuit configured such that a constant reference voltage ($V_{REF}$) is utilized in conjunction with a voltage reference regulator. For at least one embodiment, a current sense circuit may include a circuit configured such that the sense resistance ($R_{SNS}$) is a constant.

For at least one embodiment, a current sense circuit may include a circuit configured such that the input current ($I_P$) a function of the output current ($I_O$) and is defined pursuant to the equation:

$$I_P = I_M + \frac{I_O}{N}$$

where:
$I_M$=a magnetic current produced by the transformer.

For at least one embodiment, a current sense circuit may include a circuit configured such that the magnetic current ($I_M$) in a transformer is proportional to a sensed voltage ($V_S$) and is defined pursuant to the equation:

$$I_M \cong \left(\left(\frac{1}{32}\right) \times V_S \times \frac{T_{SW}}{L_M}\right)$$

where:
$L_M$=inductance of the transformer; and
$T_{SW}$=a switching frequency for the transformer.

For at least one embodiment, a current sense circuit may include a circuit configured such that a sensed voltage ($V_S$) is a function of the output voltage ($V_O$), the coil ratio (N) and an output diode voltage drop ($V_D$) and is defined pursuant to the equation:

$$V_S = -(V_O + V_D) \times N.$$

For at least one embodiment, a current sense circuit may include a circuit configured such that the output current ($I_O$) is represented by two or more fluctuations in a resulting voltage potential ($V_{CS}$) arising at a voltage sense node.

For at least one embodiment, a current sense circuit may include a circuit configured such that a resulting voltage potential ($V_{CS}$) is a function of a reference voltage ($V_{REF}$), a set resistance, a compensating resistance, and a sensed voltage ($V_S$).

For at least one embodiment, a current sense circuit may include a circuit configured such that a second reference node provides a feedback signal to a controller circuit coupled to a transformer. For at least one embodiment, the controller circuit may be configured to adjust a sensed voltage ($V_S$) by varying an operating frequency ($T_{SW}$) of the transformer.

For at least one embodiment, a current sense circuit may include a first sense diode having a first diode anode and a first diode cathode. The first diode anode may be grounded, and the first diode cathode may be connected to and/or coupled to a second terminal of a first coil of a transformer having an operating frequency ($T_{SW}$). The first coil may include a first terminal coupled to an input voltage and received at an input current ($I_P$). A second coil may be coupled to at least one output node providing an output voltage and an output current ($I_O$).

For at least one embodiment, a current sense circuit may include a second sense diode having a second diode anode and a second diode cathode. A sensing resistor may provide a sense resistance. The circuit may also include a sensing capacitor. The sensing resistor and the sensing capacitor may be grounded. The second diode anode may be connected to the second terminal and the second diode cathode may be connected, for example, in parallel, to the sensing resistor, the sensing capacitor, and to a compensating resistor at a voltage sense node.

For at least one embodiment, a current sense circuit may include a voltage reference regulator configured to operate at a reference voltage ($V_{REF}$). The voltage reference regulator may include a ground node, a first reference node, and a second reference node.

For at least one embodiment, a current sense circuit may include a set resistor having a set resistance. The set resistor may be configured to receive a sensed voltage ($V_S$).

For at least one embodiment, a current sense circuit may include a compensating resistor having a compensating resistance. The compensating resistor may be connected, for example, in parallel, at the first reference node, to the set resistor. For at least one embodiment, a current sense circuit may include a source resistor, connected for example in series to the second reference node and to a source voltage ($V_{CC}$). A feedback diode having a cathode coupled to the second reference node and an anode coupled to a feedback resistor may be included.

For at least one embodiment, a current sense circuit may include a feedback resistor coupled to a resonant circuit controller of a resonant circuit. The resonant circuit controller may be configured to adjust the operating frequency of the transformer, based upon a feedback signal received from the current sense circuit to maintain a constant output current over multiple cycles of the transformer. For at least one embodiment, the resonant circuit controller may include a self-oscillating MOSFET driver circuit.

For at least one embodiment, a current sense circuit may be configured to generate a feedback signal, for use by for example a resonant circuit controller, so as to maintain the output current as a function of the sense resistance ($R_{SNS}$), a coil ratio (N) for the transformer, a magnetic current ($I_M$) for the transformer, the compensating resistance ($R_{COMP}$), the set resistance (R38), and the reference voltage ($V_{REF}$). For at least one embodiment, the output current ($I_O$) may be a function of a reference voltage ($V_{REF}$), a sense resistance ($R_{SNS}$), and a coil ratio (N) for a transformer.

In accordance with at least one embodiment of the present disclosure a circuit for facilitating primary side regulation of a constant output current resonant transformer is disclosed. For at least one embodiment, the circuit may include a transformer having a first coil and a second coil. A coil ratio (N) defines the first coil relative to the second coil. The first coil includes a first terminal and a second terminal. The second coil generates an output current ($I_O$) and an output voltage ($V_O$). For at least one embodiment, a controller circuit may be configured to receive an input voltage ($V_{IN}$). A resonant circuit may be coupled to the controller circuit and to the first terminal. A current sense circuit may be coupled to the second terminal and the controller circuit. The current sense circuit may be configured to detect fluctuations in a sensed resulting voltage potential ($V_{CS}$). For at least one embodiment, the circuit may be configured such that the fluctuations are representative of the output current ($I_O$) of the transformer. For at least one embodiment, the current sense circuit may be configured to provide a feedback signal to the controller circuit when the sensed resulting voltage potential ($V_{CS}$) is greater than a reference voltage.

For at least one embodiment, the current sense circuit used in the circuit for facilitating primary side regulation of a constant output current resonant transformer may include a first sense diode having a first diode anode and a first diode cathode. The first diode anode is grounded. The first diode cathode may be connected to the second terminal. A second sense diode having a second diode anode and a second diode cathode may be utilized. A grounded sensing resistor providing a sense resistance may be utilized. The second diode anode may be connected to the second terminal and the second diode cathode may be connected to the sensing resistor and the compensating resistor. A voltage reference regulator may be utilized and configured to operate at a reference voltage ($V_{REF}$). The output current ($I_O$) of the transformer is a function of the reference voltage, the sense resistance, and the coil ratio.

For at least one embodiment, a circuit for facilitating primary side regulation of a constant output current resonant transformer may include a boost circuit coupled to and configured to provide an input voltage to the controller circuit. A source circuit coupled to a main electrical power source and to the boost circuit and configured to provide a rectified main power signal to the boost circuit may be utilized. The controller circuit may comprise a half-bridge controller circuit. And, the resonant circuit may comprise an inductive-capacitive resonant circuit.

Systems, methods and devices for facilitating the outputting by a resonant transformer of a constant output current using primary side regulation are also disclosed in accordance with the use of the circuits and principles of operations thereof discussed herein.

BRIEF DESCRIPTION OF THE DRAWINGS

The features, aspects, advantages, functions, modules and components of the apparatus, systems and methods provided by the various embodiments of the present disclosure are further disclosed herein regarding at least one of the following descriptions and accompanying drawing figures.

DETAILED DESCRIPTION

The various embodiments described herein are directed to apparatus, systems, and methods for regulating the output current of a power converter using primary side regulation. More specifically, the embodiments described herein are directed to methods, systems, and apparatus for regulating the output current of a resonant switch mode operated power converter. The embodiments described herein may find use in electronic devices, such as power converters configured for use with LED assemblies, personal communications devices, industrial devices, automotive devices, and with any device where a constant output current is desired to be provided by a power converter providing a low, medium and/or high-power output. While the various embodiments set forth herein, and as shown in the attached drawing figures, provide sufficient information for a person of ordinary skill in the art to practice one or more of the inventions, as claimed herein or as later claimed in any application claiming priority to this disclosure, it is to be appreciated that one or more embodiments may be practiced without one or more of the details provided herein. As such, the various embodiments described herein are provided by way of example and are not intended and should not be used to limit the scope of any invention claimed to any embodiment.

Figure 1A:
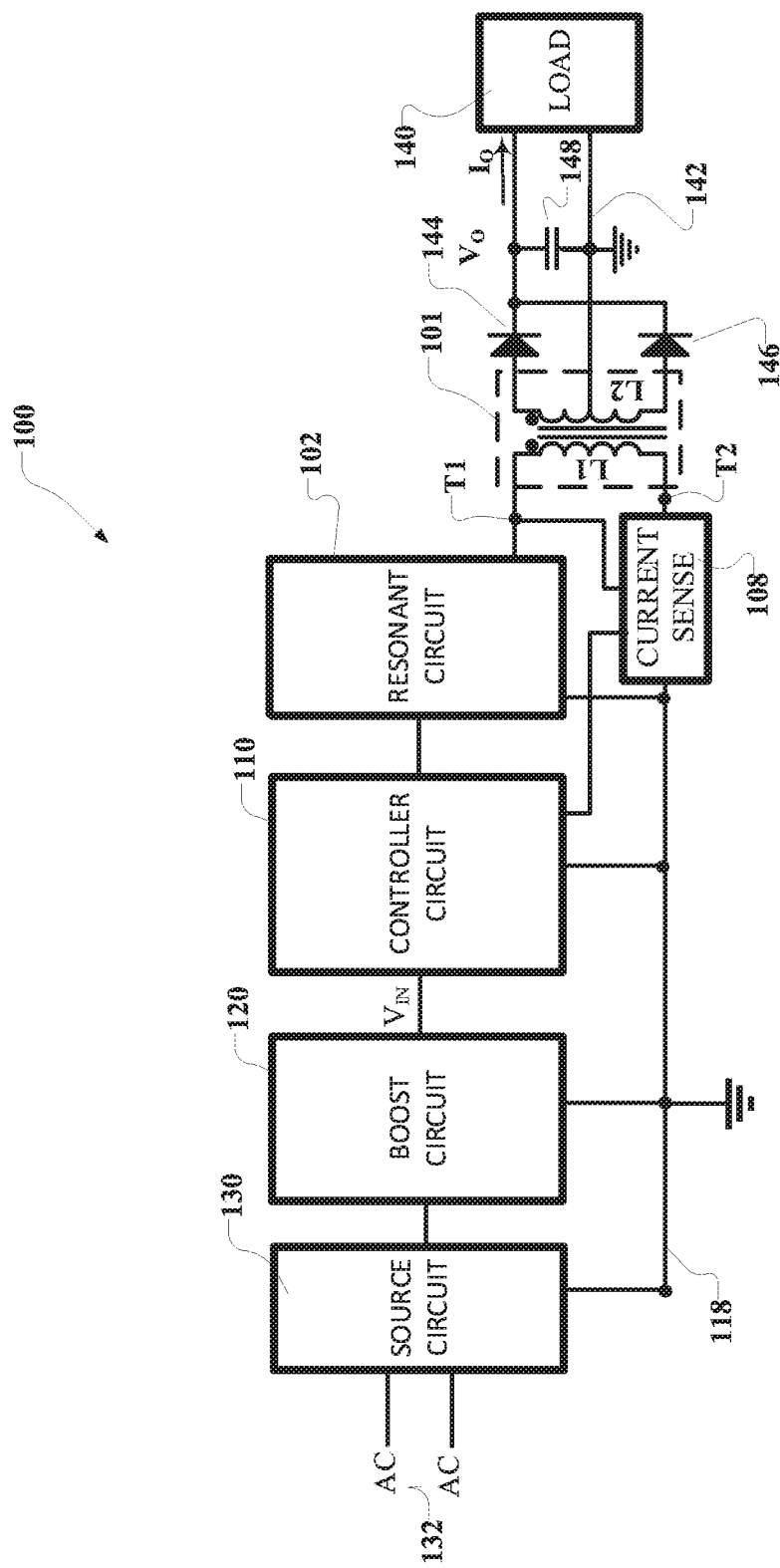
FIG. 1A is schematic representation of an electrical circuit for controlling the output current of a power converter in accordance with at least one embodiment of the present disclosure.
Figure 1B:
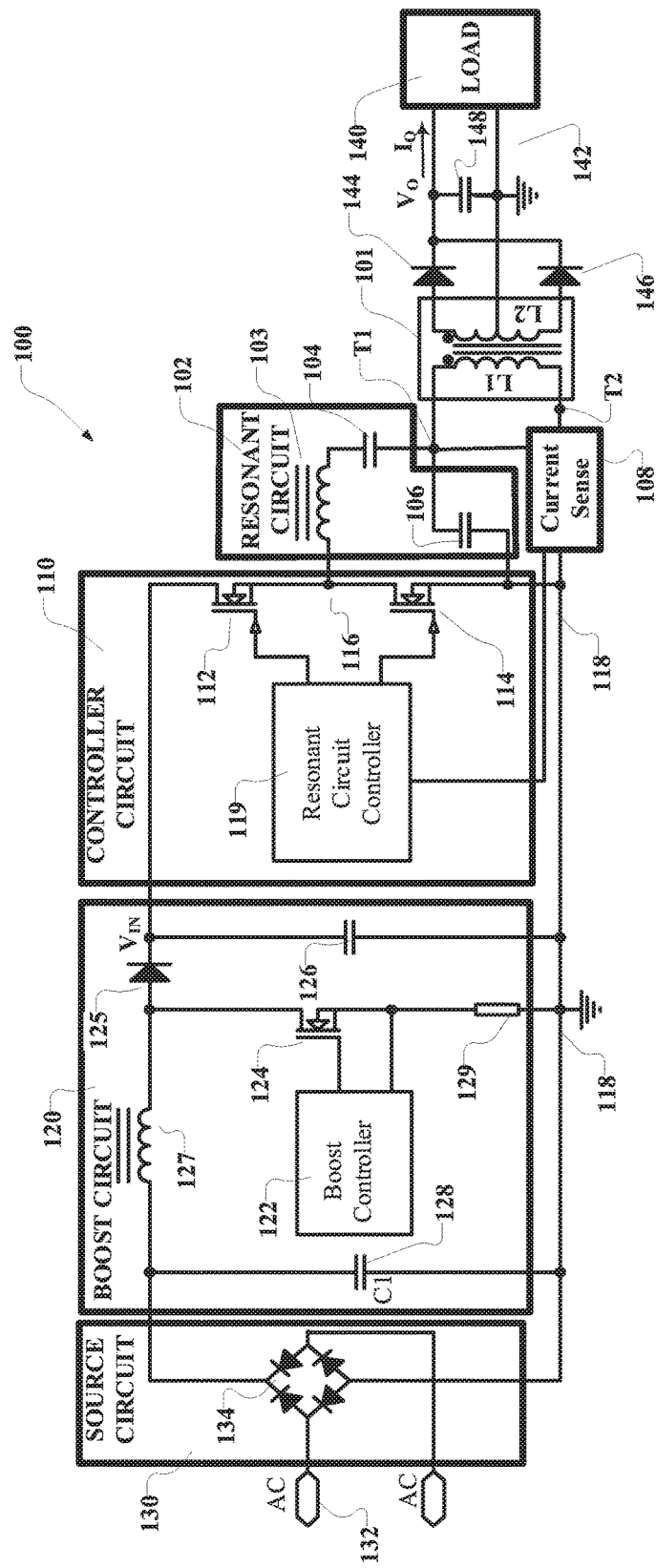
FIG. 1B is a schematic representation of an electrical circuit including a resonant circuit controller and for use in controlling the output current of a power converter in accordance with at least one embodiment of the present disclosure.

As shown in FIGS. 1A and 1B and for at least one embodiment of the present disclosure, a power converter 100 includes a resonant type topology where electrical isolation arises between a primary side and a secondary side of a transformer 101. The transformer 101 may include a first coil L1 having a first number of windings $N_P$ and a second coil L2 having a second number of windings $N_S$. $N_P$ is commonly greater or lesser than $N_S$ depending upon whether a boost or a deduction in the input voltage relative to the output voltage of the power converter is desired. It is to be appreciated that the various embodiments of the present disclosure are not limited to resonant type power converters and may be used in conjunction with other topologies.

Primary Side of Power Converter

The primary side of the transformer 101 includes a first coil L1 having a first terminal T1 and at least one second terminal T2. For at least one embodiment, the first coil L1 is suitably connected to a resonant circuit 102. The resonant circuit 102 is suitably coupled to a controller circuit 110 configured to control the operating frequency $T_{SW}$ of the transformer 101. The controller circuit 110 may utilize any desired configuration to control one or more switches used to adjust the operating frequency $T_{SW}$ of the transformer and thereby regulate output voltage $V_O$ and the output current $I_O$ of the power converter 100. The controller circuit 110 may be coupled to a boost circuit 120. The boost circuit 120 may be configured in any desired configuration, such as in a buck converter configuration, to adjust an input voltage $V_{IN}$ provided to the controller circuit 110 to a desired potential. The boost circuit 120 may be coupled to a source circuit 130 configured to adjust, isolate, filter or otherwise regulate, condition and/or control source power provided to the power converter 100 by a main source 132. For at least one embodiment, the main source 132 may include an alternating current (AC) source, such as one provided by an automobile's alternator, by a household or business power source, or otherwise.

The second terminal T2 of the transformer 101 may be coupled to a current sense circuit 108 configured to sense the currents arising through the first coil L1. The current sense circuit may be configured to estimate, to a desired degree of precision, the currents arising through the second coil L2. Each of the resonant circuit 102, sense circuit 108, controller circuit 110, boost circuit 120, and source circuit 130 may also be coupled to a common node, such as ground node 118.

More specifically and as shown in FIG. 1B, the resonant circuit 102 may include an inductive capacitive circuit configured in an LC, LLC, LCC or other configuration—as desired for any given implementation of an embodiment of the present disclosure. In FIG. 1B, an LCC resonant circuit is shown which includes a first resonant component 103, such as an inductor, a second resonant component 104, such as capacitor, and a third resonant component 106, such as a second capacitor. Other components may be utilized as desired. The sizing, characteristics and configuration of the resonant circuit components may be as desired for any given implementation.

As shown in FIG. 1B, the current sense circuit 108 may be coupled to the ground node 118 and the power converter 100 may include a controller circuit 110 that is coupled to the resonant circuit 102 and to the ground node 118. The controller circuit 110 may be used to control the operating frequency $T_{SW}$ of the transformer 101 and thereby the output voltage $V_O$ and output current $I_O$ provided by the power converter 100 to a load 140. For at least one embodiment, the output current $I_O$ is desirably maintained by the controller circuit 110 at a constant value. The controller circuit 110 may include one or more switching elements that are used to control the operations of the transformer 101. For at least one embodiment, a first switch 112 and a second switch 114 are configured into a half-bridge configuration and are coupled to the resonant circuit 102 at a first node 116 and to the ground node 118. The first switch 112 and second switch 114 may be configured using any desired device technologies, such as MOSFET or otherwise. It is to be appreciated that the switching element configurations, including single switching configuration, may be used in conjunction with other embodiments. Such switches may internal or external to a given controller element, such as controller circuit 110.

The controller circuit 110 may also include a resonant circuit controller 119 configured to control the operations of the first switch 112 and the second switch 114. The first and second switches may be controlled such that output current $I_O$ and the output voltage $V_O$ are regulated, as desired for any given implementation. For one implementation, the output current $I_O$ is regulated at a constant current by resonant circuit controller 119. One non-limiting example of a resonant circuit controller 119 that may be used in conjunction with at least one embodiment of the present disclosure is the NCL30059 "High-Voltage Half-Bridge Controller for LED Lighting Applications", manufactured by ON Semiconductor Company, Phoenix Ariz. It is to be appreciated that the resonant circuit controller 119 and the power converter 100 may be configured to support a fixed, narrow or wide range of output power, operating frequencies, or otherwise. It is to be further appreciated that low-power, medium-power and high-power ranges may be supported by at least one embodiment.

As shown in FIG. 1B, the controller circuit 110 may be coupled to an (optional) boost circuit 120. When included, the boost circuit 120 may utilize any desired configuration. In accordance with at least one embodiment, the boost circuit 120 may include use of a boost controller 122 and a boost switch 124. One non-limiting example of a boost controller that may be used in conjunction with at least one embodiment of the present disclosure is the NCP1602 "Enhanced, High-Efficiency Power Factor Controller," manufactured by ON Semiconductor Company, Phoenix Ariz. It is to be appreciated that a diode 125, inductor 127, and capacitor 126 may be used to couple the boost circuit 120 to the controller circuit 110 and provide the input voltage $V_{IN}$ to the controller circuit 110. Further, a filtering, conversion and/or control of input power signals to prevent undesired electro-magnetic emissions, over-voltage conditions or otherwise may be provided by use of capacitor 128, a boost resistor 129 to provide limited isolation of the boost switch 124 to the ground node 118, and/or other components known in the art. It is to be appreciated, that any configuration of circuit components for the boost circuit 120 may vary, as desired for a given implementation. It is to be appreciated that as used herein, ground node 118 may also be used to refer to a return or common node of a system in which the power converter 100 is intended to be utilized.

The boost circuit 120 may be suitably coupled to a main source 132, such as an alternating current source (AC). Such components used to couple the boost circuit 120 to the main source 132 may vary based on implementation. For one non-limiting embodiment, a rectifier bridge 128 may be used to couple the boost circuit 120 to the main source 132 and to convert an alternating current into a direct current. It is to be appreciated, however, that the main source 132 may itself provided a direct current, and that use of a rectifier bridge 128 may not be needed.

Secondary Side of Power Converter

Second Coil, L2:

The secondary side of the power converter 100 provides an output power $V_O$ and output current $I_O$ to a load 104. The secondary side includes the before mentioned second coil L2 of transformer 101. The secondary side may include various combinations of capacitors, rectifiers, resistors, inductors or other circuit components to filter, condition, regulate or otherwise the output voltage $V_O$ and output current $I_O$ at the desired values or ranges thereof. As used in conjunction with at least one embodiment, the output current $I_O$ is provided at a constant current value. As shown for illustrative purposes only, output components may include first output diode 144, second output diode 146, and output capacitor 148. The output capacitor 148 may function to filter out undesired variations in the output power over one or more switching cycles for the power converter 100. The secondary side is typically grounded or connected to a second ground/common/return node 142. For at least one embodiment, the second ground node 142 is electrically isolated from the first ground node 118. The load 140 may be any desired load, such as an LED assembly or otherwise.

Current Sense Circuit

Figure 2A:
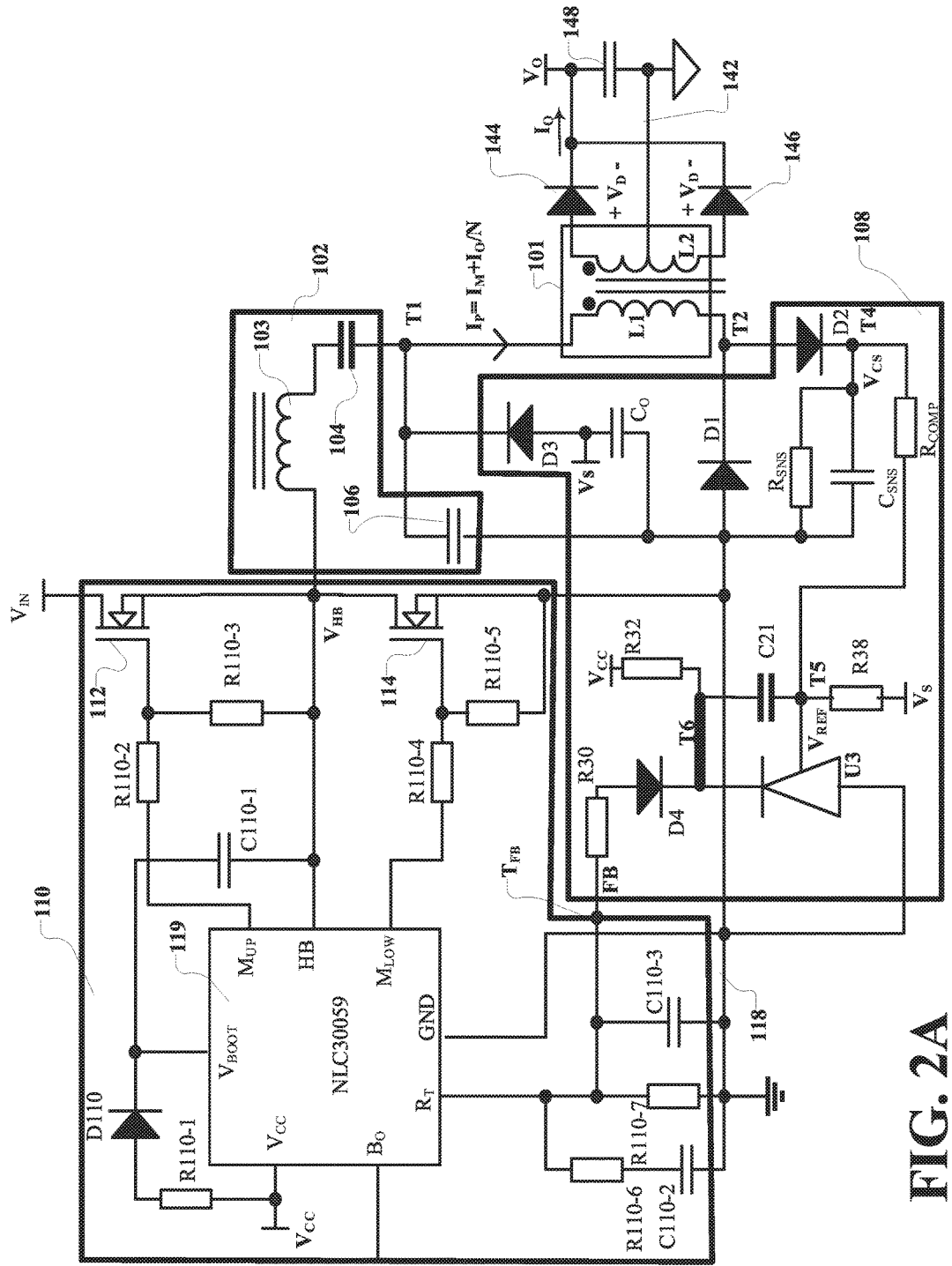
FIG. 2A is a schematic representation of a current sense circuit configured to influence a timing resistor of a resonant circuit controller and in accordance with at least one embodiment of the present disclosure.

In FIG. 2A, an embodiment of the present disclosure where an NCL30059 half bridge controller is used as the resonant circuit controller 119 is shown. As discussed above, the resonant circuit controller 119 may be configured to control the operation of the first switch 112 and the second switch 114, such that the input voltage YIN is regulated and provided to the resonant circuit 102 at a desired voltage. The resonant circuit controller 119 may use pulse mode frequency modulation (PFM) for at least one embodiment. As is commonly known and appreciated, PFM may be used to vary the operating frequency of the transformer, and thereby regulate the output voltages produced by the power converter 100. Further, the resonant circuit controller 119 may be configured to facilitate regulation and control of the input/primary currents, and thereby the secondary/output currents, of the transformer 101. In accordance with at least one embodiment of the present disclosure, the controller circuit 110 and the resonant circuit controller 119 are configured to regulate the output/secondary current $I_O$ at a constant current based upon sensing of the input/primary current $I_P$ for the transformer 101. The resonant circuit controller 119, such as when configured using the NCL30059 device, may be used in conjunction with various discrete components to provide signal condition, stabilization, filtering or otherwise. The operation and functions of such discrete components are apparent to a person having ordinary skill in the art and thus beyond the scope of the present disclosure. Such discrete components may include those shown, such as resistors R110-1 to R110-7, diode D110, and capacitors C110-1 to C110-3. As shown, the current sense circuit 108 is coupled to the controller circuit 110 such that a feedback signal FB is output and provided to the controller circuit 110 at feedback terminal $T_{FB}$.

Figure 2B:
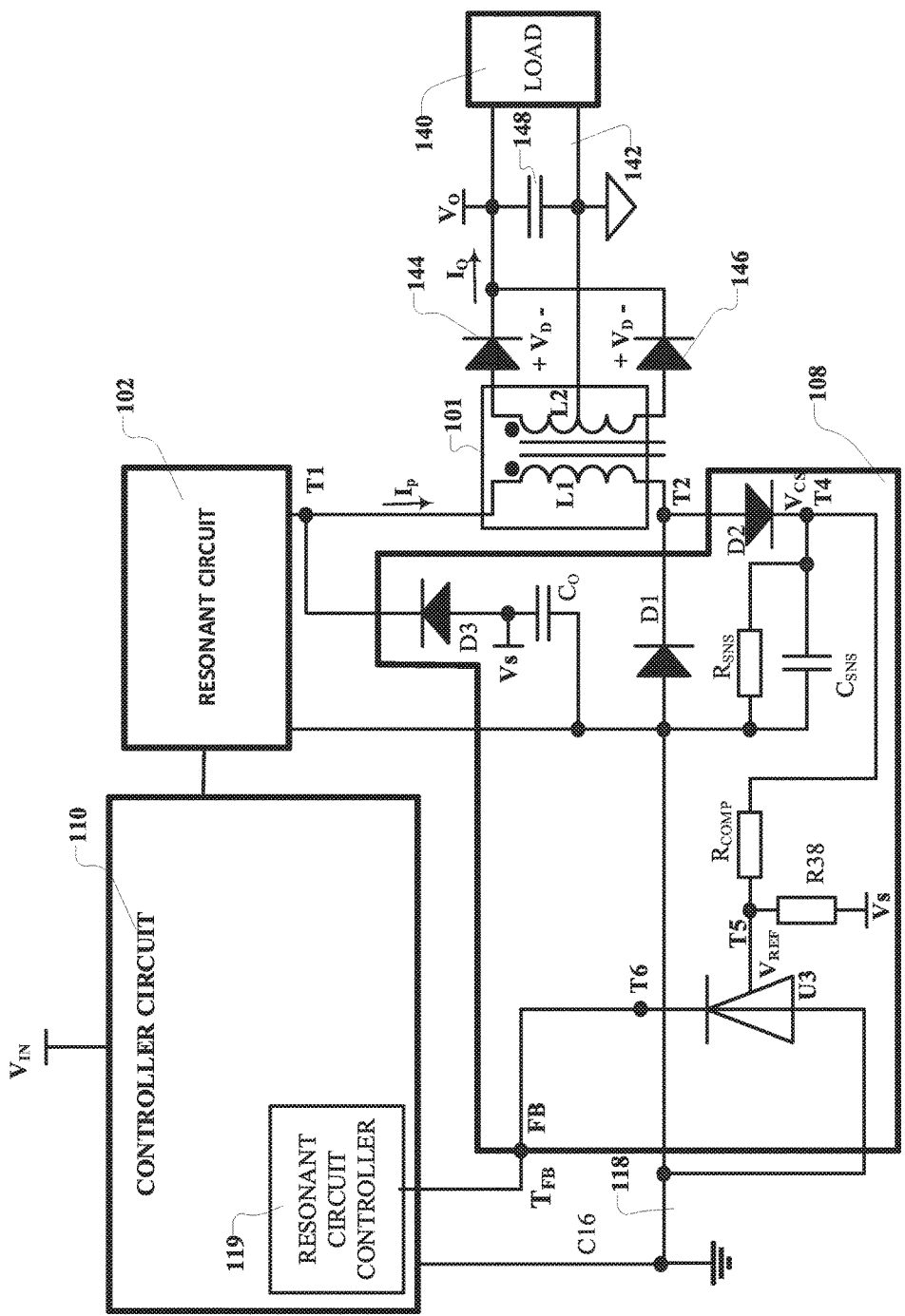
FIG. 2B is a schematic representation of a current sense circuit configured to influence the operations of a resonant circuit controller and in accordance with at least one embodiment of the present disclosure.
Figure 3A:
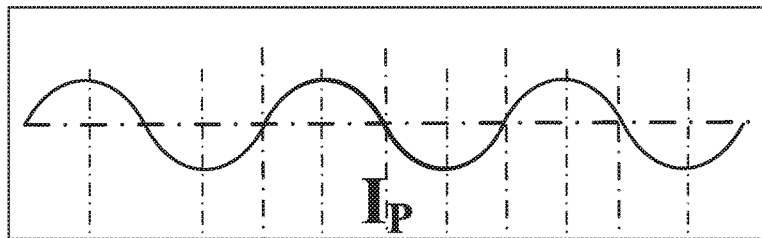
FIG. 3A represents a primary current arising over time in a transformer and in accordance with at least one embodiment of the present disclosure.
Figure 3B:
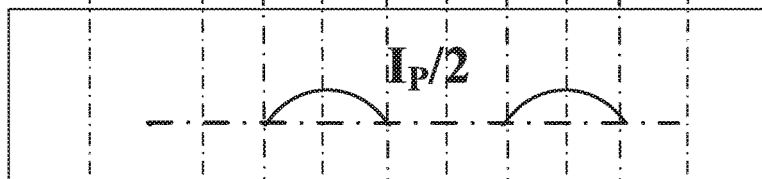
FIG. 3B represents a first half-cycle portion of a primary current in a transformer, arising over time, and in accordance with at least one embodiment of the present disclosure.
Figure 3C:
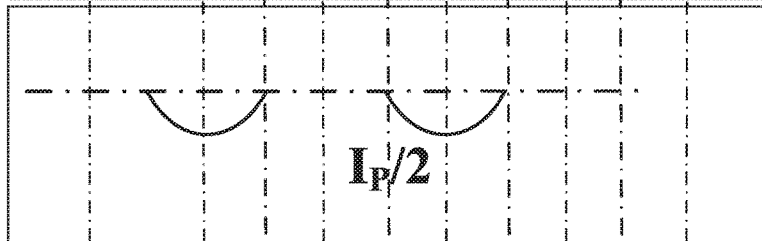
FIG. 3C represents a second half-cycle portion of a primary current in a transformer, arising over time, and in accordance with at least one embodiment of the present disclosure.
Figure 3D:
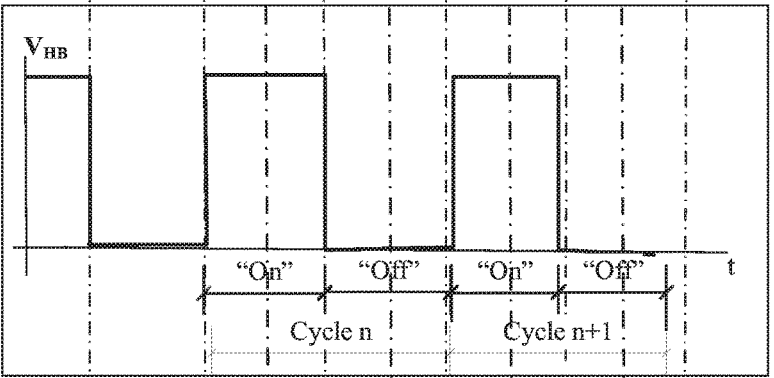
FIG. 3D represents fluctuations in a voltage output of a controller circuit, arising over time, and in accordance with at least one embodiment of the present disclosure.
Figure 3E:
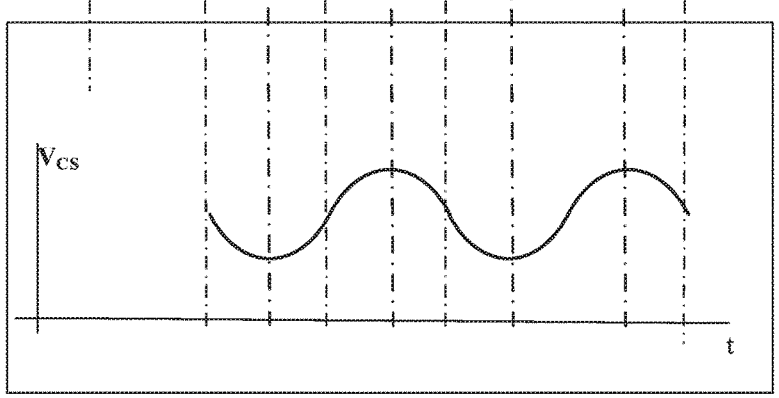
FIG. 3E represents fluctuations in sensed voltage in a primary side of a transformer, arising over time, and in accordance with at least one embodiment of the present disclosure.

As shown in FIGS. 2A and 2B, the current sense circuit 108 may be configured to include a first sense diode D1, a second sense diode D2, a sensing resistor $R_{SNS}$ and a sensing capacitor $C_{SNS}$. It is to be appreciated that over multiple switching cycles of the transformer, the primary current $I_P$ fluctuates, for example as shown sinusoidally, between a range of positive values and a range of negative values, as shown in FIGS. 3A-3C, with the combination of a positive portion and a negative portion constituting a single switching cycle. It is to be appreciated that the shape of the primary current $I_P$ will vary as the switching frequency changes. For example, when a higher switching frequency is utilized, the shape of the $I_P$ current may shorten, with a lower switching frequency, the shape of $I_P$ may extend, to approach a more sinusoidal shape. By extending and/or shortening the shape of $I_P$, from one switching cycle to a next, a constant output current may be realized. Further, during half of each switching cycle, the voltages induced by the fluctuations of the primary current $I_P$ will vary from a first "on" value to a second "off" value, as shown in FIG. 3D. These fluctuations, or pulses, arise from the turning "on" and "off" of the first switch and/or second switch. The voltage fluctuations mirror the primary current $I_P$, and for at least one embodiment are sensed for half of each switching cycle (e.g., "Cycle n" as shown in FIG. 3D) by the circuit formed by the combination of the second sense diode D2, the adjustable sense resistor $R_{SNS}$ and the filtering clamp capacitor $C_{SNS}$, as shown in FIGS. 2A and 2B. The resulting voltage potential $V_{CS}$ will fluctuate, sinusoidally, as shown in FIG. 3E, and accordingly with the sampled half of the primary current $I_P$ at node T4. It is to be appreciated, that by sensing the voltage induced across the first coil L1 for only half of each switching cycle errors arising due to undesired switching noises may be minimized.

As shown in FIGS. 2A and 2B, the sensed output current, as represented by the fluctuations in $V_{CS}$, are provided to a compensating resistor $R_{COMP}$ which is connected in parallel at first reference node T5 to a voltage reference regulator U3 and set resistor R38. In at least one embodiment, U3 may be an NCV431B "Low Voltage Precision Adjustable Shunt Regulator," manufactured by ON Semiconductor Company, Phoenix Ariz. As shown, at first reference node T5, a reference voltage $V_{REF}$ is associated with the voltage reference regulator. For at least one embodiment, the reference voltage $V_{REF}$ is 1.24 volts. It is to be appreciated that the reference voltage $V_{REF}$ may be fixed, may provide a different reference voltage, and/or be adjustable as desired for at least one embodiment. The value of compensation resistor $R_{COMP}$ may be fixed or variable. It is to be appreciated that higher output voltages may require a larger compensation resistor. As shown, the voltages arising from the compensating resistor $R_{COMP}$ and resistor R38 are combined at first reference node T5. When and while these voltages exceed the reference voltage $V_{REF}$, regulator U3 is activated, and a feedback signal is provided to the controller via the feedback terminal $T_{FT}$. It is to be appreciated, that resulting voltage potential $V_{CS}$ associated with the sensed output current may need to be compensated when higher output voltages are provided by the power converter 100. The relationship between $V_S$ and $V_{CS}$ may be determined as per Equation 1, where for at least one embodiment $V_{REF}$ and R38 are fixed values.

$$V_{CS} = \left(\frac{R_{COMP} + R38}{R38}\right) \times V_{REF} - \frac{R_{COMP}}{R38} \times V_S \cong \quad \text{Equation 1}$$

$$V_{REF} - \frac{R_{COMP}}{R38} \times V_S$$

Where $R38 \gg R_{COMP}$

As further shown, the sensed voltage $V_S$ is generated by capacitor $C_O$ and diode D3. It is to be appreciated that $V_S$ is a function of the output power $V_O$ of the power converter, the voltage drops across the output diodes 144 and 146 and the turn ration N, as expressed mathematically by Equation 2, where the output diode voltage drop $V_D$ is typically about 0.7 volts.

$$V_S = -(V_O + V_D) \times N \quad \text{Equation 2}$$

further shown in FIGS. 2A and 2B, the voltage reference regulator U3 is suitably coupled to provide a feedback signal FB to the resonant circuit controller 119. The feedback signal FB may be used to adjust the switching frequency of the power converter and thereby regulate the output current of the power converter. It is to be appreciated that since $V_S$ represents the output voltage $V_O$, the feedback signal FB can account for both variations in the output voltage, while also facilitating regulation of the output current $I_O$ at a constant value.

As shown in FIG. 2A, to facilitate such regulating, for at least one embodiment, the voltage reference regulator U3 is coupled via a second reference node T6 and source resistor R32 to a source voltage $V_{CC}$, where C21 is a compensating capacitor. It is to be appreciated that the source voltage $V_{CC}$ provides a minimum bias current used by source resistor R32. The minimum bias current minimizes the occurrence of false feedback signaling. For at least one embodiment, source voltage $V_{CC}$ is provided by the boost circuit 120. It is to be appreciated that for at least one embodiment a constant output current is maintained by determining a difference by the resonant circuit controller 119 based on the feedback signal FB between a reference voltage of the resonant circuit controller 119 and a minimum voltage of a regulator as applied across resistor R30 and via feedback diode D4. It is to be appreciated, that as the current flowing out of the resonant circuit controller 119 via the $R_T$ pin changes, the switching frequency of the power converter 100 also changes and the output current $I_O$ can be regulated. Such regulation desirably results in an average constant output current, with any deviations from such average arising within an acceptable range.

As shown in FIGS. 2A and 2B, the current sense circuit 108 may be configured to sense the output current $I_O$ based on the primary current $I_P$ through the transformer 101. It is to be appreciated that the transformer current $I_P$ includes two parts, the output current $I_O$ and the magnetic current $I_M$. It is to be further appreciated that $I_O$ is not directly measurable when primary side regulation is used. However, the output current $I_O$ is reflected in the primary current $I_P$ as a function of the magnetic current $I_M$ and the ratio N of the number of first coil L1 windings $N_P$ to the number of second coil L2 windings $N_S$. Further, it is to be appreciated that the magnetic current $I_M$ is also a function of the frequency of the transformer's operating frequency $T_{SW}$, the inductance $L_M$ of the transformer, and the then sensed voltage $V_S$. These relationships can be expressed mathematically in Equations 3-5 as follows:

$$I_P = I_M + \frac{I_O}{N} \quad \text{Equation 3}$$

where: N=coil ratio=$N_P/N_S$
$I_P$=transformer current, primary side;
$I_O$=output current;
$I_M$=magnetic current;
$N_P$=primary windings=the number of windings for the first coil L1; and
$N_S$=secondary windings=the number of windings for the second coil L2.

$$I_M \cong \left(\left(\frac{1}{32}\right) \times V_S \times \frac{T_{SW}}{L_M}\right) \quad \text{Equation 4}$$

where: $V_S$=the sensed voltage;
$T_{SW}$=the operating frequency for the transformer; and
$L_M$=inductance of the transformer.

$$I_O = \frac{(I_P - I_M) \times N_S}{N_P} \quad \text{Equation 5}$$

Further, it is to be appreciated that the output current $I_O$ is a function of the reference voltage $V_{REF}$, the sense resistor $R_{SNS}$ and the ratio N, this relationship can be expressed mathematically as per Equation 6.

$$I_O \cong \left(2 \times \left(\frac{V_{REF}}{R_{SNS}}\right)\right) \div N \quad \text{Equation 6}$$

It is to be appreciated that when $V_{REF}$ and N are fixed values, a change in the value of the sense resistor $R_{SNS}$ results in a corresponding change in the value of the output current $I_O$, such that $I_O$ can be maintained at a constant value over a given number of switching cycles by suitably adjusting the value of the sense resistor $R_{SNS}$.

Further, adjustments to the operating frequency $T_{SW}$ by the resonant circuit controller 119 may also be used to account for any cycle to cycle deviations to maintain a constant output current at the output current value specified in view of the value of $R_{SNS}$ for a given transformer. It is also to be appreciated that for other embodiments, one or more of the reference voltage $V_{REF}$, number of windings, or value of the sense resistor $R_{SNS}$ may be varied to maintain a constant output current $I_O$.

Accordingly, it is to be appreciated that a device, system and method for maintaining a constant output current, using primary side regulation, is described, where a sense resistor is utilized to set an output current at a desired value and a controller is utilized to adjust the switching frequency of the power converter based on the sensed primary current, while also adjusting the operating frequency based on variations in the output voltage.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. The components used and described herein may be provided in one or more integrated circuit assemblies and may include the use of commonly known circuit elements including, but not limited to, logical, discrete elements, active and passive elements. Other embodiments are therefore contemplated. It is intended that all matter contained in the above description and shown in the accompanying drawings shall be interpreted as illustrative only of embodiments and not limiting. References to first, second, etc. terminals, coils, components or otherwise are for purposes of explanation and clarity only and are not intended to be limiting. Changes in detail or structure may be made without departing from the basic elements of the invention as defined in the following claims. Additionally, the words "connected" and "coupled" are used throughout for clarity of the description and should be interpreted as including either a direct connection or an indirect connection. Such connections may include electrical, optical, electro-optical, mechanical, electro-magnetic or otherwise, as such connections would be known by one of ordinary skill in the art.

What is claimed is:
1. A current sense circuit, comprising:
a first sense diode having a first diode anode and a first diode cathode;
wherein the first diode anode is grounded; and
wherein the first diode cathode is connected to a second terminal of a first coil of a transformer having an operating frequency ($T_{SW}$);

wherein the first coil includes a first terminal coupled to an input voltage received at an input current ($I_P$);

wherein the transformer includes a second coil coupled to at least one output node providing an output voltage and an output current ($I_O$);

a second sense diode having a second diode anode and a second diode cathode;

a sensing resistor providing a sense resistance;

a sensing capacitor;

wherein the sensing resistor and the sensing capacitor are grounded;

a voltage reference regulator configured to operate at a reference voltage ($V_{REF}$), comprising:
a ground node;
a first reference node; and
a second reference node;

a set resistor having a set resistance ($R_{SNS}$);
wherein the set resistor is configured to receive a sensed voltage ($V_S$); and a compensating resistor having a compensating resistance ($R_{COMP}$);
wherein the compensating resistor is connected, in parallel, at the first reference node, to the set resistor;

wherein the second diode anode is connected to the second terminal and the second diode cathode is connected, in parallel, to the sensing resistor, the sensing capacitor, and the compensating resistor at a voltage sense node.

2. The current sense circuit of claim 1, wherein the output current ($I_O$) is output at a constant value over two or more cycles of the transformer.

3. The current sense circuit of claim 2, wherein the output current ($I_O$) is a function of the sense resistance ($R_{SNS}$).

4. The current sense circuit of claim 3, wherein the sensing resistor is a variable resistance resistor.

5. The current sense circuit of claim 3, wherein the output current ($I_O$) is defined pursuant to the equation:

$$I_O \cong \left(2 \times \left(\frac{V_{REF}}{R_{SNS}}\right)\right) \div N$$

where:
N = a coil ratio for the transformer.

6. The current sense circuit of claim 5, wherein the reference voltage ($V_{REF}$) is a constant.

7. The current sense circuit of claim 5, wherein the sense resistance ($R_{SNS}$) is a constant.

8. The current sense circuit of claim 5, wherein the input current ($I_P$) a function of the output current ($I_O$) and is defined pursuant to the equation:

$$I_P = I_M + \frac{I_O}{N}$$

where:
$I_M$ = a magnetic current produced by the transformer.

9. The current sense circuit of claim 8, wherein the magnetic current ($I_M$) is proportional to the sensed voltage ($V_S$) and is defined pursuant to the equation:

$$I_M \cong \left(\left(\frac{1}{32}\right) \times V_S \times \frac{T_{SW}}{L_M}\right)$$

where:
$L_M$ = inductance of the transformer; and
$T_{SW}$ = a switching frequency for the transformer.

10. The current sense circuit of claim 9, wherein the sensed voltage ($V_S$) is a function of the output voltage ($V_O$), the coil ratio (N) and an output diode voltage drop ($V_D$) and is defined pursuant to the equation:

$$V_S = -(V_O + V_D) \times N$$

11. The current sense circuit of claim 5, wherein the output current ($I_O$) is represented by two or more fluctuations in a resulting voltage potential ($V_{CS}$) arising at the voltage sense node.

12. The current sense circuit of claim 11, wherein the resulting voltage potential ($V_{CS}$) is a function of the reference voltage ($V_{REF}$), the set resistance, the compensating resistance, and the sensed voltage ($V_S$).

13. The current sense circuit of claim 12, wherein the second reference node provides a feedback signal to a controller circuit coupled to the transformer;

wherein the controller circuit adjusts the sensed voltage ($V_S$) by varying an operating frequency ($T_{SW}$) of the transformer.

14. A current sense circuit, comprising:
a first sense diode having a first diode anode and a first diode cathode;
wherein the first diode anode is grounded; and
wherein the first diode cathode is connected to a second terminal of a first coil of a transformer having an operating frequency ($T_{SW}$);

wherein the first coil includes a first terminal coupled to an input voltage and received at an input current ($I_P$);

wherein the transformer includes a second coil coupled to at least one output node providing an output voltage and an output current ($I_O$);

a second sense diode having a second diode anode and a second diode cathode;

a sensing resistor providing a sense resistance;

a sensing capacitor;
wherein the sensing resistor and the sensing capacitor are grounded;

wherein the second diode anode is connected to the second terminal and the second diode cathode is connected, in parallel, to the sensing resistor, the sensing capacitor, and the compensating resistor at a voltage sense node;

a voltage reference regulator configured to operate at a reference voltage ($V_{REF}$), comprising:
a ground node;
a first reference node; and
a second reference node;

a set resistor having a set resistance;
wherein the set resistor is configured to receive a sensed voltage ($V_S$);

a compensating resistor having a compensating resistance;
wherein the compensating resistor is connected, in parallel, at the first reference node, to the set resistor;

a source resistor, connected in series to the second reference node and to a source voltage ($V_{CC}$);

a feedback diode having a cathode coupled to the second reference node and an anode coupled to a feedback resistor;
   wherein the feedback resistor is coupled to a resonant circuit controller of a resonant circuit; and
wherein the resonant circuit controller is configured to adjust the operating frequency of the transformer, based upon a feedback signal received from the current sense circuit to maintain a constant output current over multiple cycles of the transformer.

15. The current sense circuit of claim 14,
wherein the resonant circuit controller is a self-oscillating MOSFET driver circuit.

16. The current sense circuit of claim 14,
wherein the feedback signal is generated to maintain the output current as a function of the sense resistance ($R_{SNS}$), a coil ratio (N) for the transformer, a magnetic current ($I_M$) for the transformer, the compensating resistance ($R_{COMP}$), the set resistance (R38), and the reference voltage ($V_{REF}$).

17. The current sense circuit of claim 14,
wherein the output current ($I_O$) is a function of the reference voltage ($V_{REF}$), the sense resistance ($R_{SNS}$), and the coil ratio (N).

18. A circuit for primary side regulation of a constant output current resonant transformer, comprising:
   a transformer having a first coil and a second coil;
      wherein a coil ratio (N) defines the first coil relative to the second coil;
      wherein the first coil has a first terminal and a second terminal;
      wherein the second coil generates an output current ($I_O$) and an output voltage ($V_O$);
   a controller circuit configured to receive an input voltage ($V_{IN}$);
   a resonant circuit coupling the controller circuit with the first terminal;
   a current sense circuit coupled to the second terminal and the controller circuit;
      wherein the current sense circuit is configured to detect fluctuations in a sensed resulting voltage potential ($V_{CS}$);
      wherein the fluctuations are representative of the output current ($I_O$) of the transformer;
      wherein the current sense circuit is configured to provide a feedback signal to the controller circuit when the sensed resulting voltage potential ($V_{CS}$) is greater than a reference voltage; and
      wherein the feedback signal is representative of both the output current ($I_O$) and the output voltage ($V_O$) of the transformer.

19. The circuit for primary side regulation of a constant output current resonant transformer of claim 18, comprising:
   wherein the current sense circuit comprises:
      a first sense diode having a first diode anode and a first diode cathode;
         wherein the first diode anode is grounded; and
         wherein the first diode cathode is connected to the second terminal;
      a second sense diode having a second diode anode and a second diode cathode;
      a grounded sensing resistor providing a sense resistance;
         wherein the second diode anode is connected to the second terminal and the second diode cathode is connected, in parallel, to the sensing resistor and the compensating resistor at a voltage sense node;
      a voltage reference regulator configured to operate at a reference voltage ($V_{REF}$); and
   wherein the output current ($I_O$) is a function of the reference voltage, the sense resistance, and the coil ratio.

20. The circuit for primary side regulation of a constant output current resonant transformer of claim 18, comprising:
   a boost circuit coupled to and configured to provide an input voltage to the controller circuit;
   a source circuit coupled to a main electrical power source and to the boost circuit and configured to provide a rectified main power signal to the boost circuit;
   wherein the controller circuit comprises a half-bridge controller circuit; and
   wherein the resonant circuit comprises an inductive-capacitive resonant circuit.

* * * * *